US012665603B2

(12) United States Patent
Lee et al.

(10) Patent No.: US 12,665,603 B2
(45) Date of Patent: Jun. 23, 2026

(54) CALIBRATION FOR A RECEIVER BY USING NEIGHBORING RECEIVE PATHS

(71) Applicant: QUALCOMM Incorporated, San Diego, CA (US)

(72) Inventors: Jang Joon Lee, San Diego, CA (US); Aleksandar Miodrag Tasic, San Diego, CA (US); Prakash Thoppay Egambaram, San Diego, CA (US); Kyle David Holland, San Diego, CA (US); Chih-Fan Liao, San Diego, CA (US); Tomas O'Sullivan, San Mateo, CA (US); Dhon-Gue Lee, San Diego, CA (US); Dongling Pan, San Diego, CA (US); Chirag Dipak Patel, San Diego, CA (US); Yangchuan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/783,547

(22) Filed: Jul. 25, 2024

(65) Prior Publication Data

US 2025/0038752 A1 Jan. 30, 2025

Related U.S. Application Data

(60) Provisional application No. 63/516,376, filed on Jul. 28, 2023.

(51) Int. Cl.
H03D 3/24 (2006.01)
H03L 7/099 (2006.01)
H03L 7/10 (2006.01)

(52) U.S. Cl.
CPC .............. H03L 7/099 (2013.01); H03L 7/101 (2013.01)

(58) Field of Classification Search
CPC ................... H04L 7/033; H04L 7/0337; H04L 2027/0016; H04L 25/061; H03L 7/0891; H03L 7/093; H03L 7/087
(Continued)

(56) References Cited

U.S. PATENT DOCUMENTS

| | | | | |
|---|---|---|---|---|
| 6,441,783 B1 * | 8/2002 | Dean | ........................ | G01S 7/032 |
| | | | | 342/372 |
| 2003/0038618 A1 * | 2/2003 | Gumm | ................... | H04B 17/16 |
| | | | | 324/76.53 |

(Continued)

FOREIGN PATENT DOCUMENTS

| | | |
|---|---|---|
| EP | 4167493 A1 | 4/2023 |
| WO | 2022191956 A1 | 9/2022 |

OTHER PUBLICATIONS

International Search Report and Written Opinion—PCT/US2024/039679—ISA/EPO—Feb. 14, 2025.
(Continued)

*Primary Examiner* — Khai Tran
(74) *Attorney, Agent, or Firm* — Patterson + Sheridan LLP

(57) ABSTRACT

Certain aspects of the present disclosure are directed towards apparatus and techniques for receiver calibration. An example apparatus generally includes: a first receiver having a first oscillating signal generation circuit, an output of the first oscillating signal generation circuit being coupled to an input of a first splitter, wherein the first splitter has multiple outputs; a second receiver having a second oscillating signal generation circuit coupled to an LO input of each of a first plurality of mixers of the second receiver; and signal paths between the multiple outputs of the first splitter and signal inputs of the first plurality of mixers, respectively.

20 Claims, 12 Drawing Sheets

(58) Field of Classification Search
USPC ........................... 375/376, 373; 455/103, 127
See application file for complete search history.

(56) References Cited

U.S. PATENT DOCUMENTS

| 2011/0286553 | A1 | 11/2011 | Min et al. |
| 2014/0171001 | A1 | 6/2014 | Fernando et al. |
| 2015/0118980 | A1 | 4/2015 | Leung et al. |
| 2025/0024429 | A1* | 1/2025 | Xu ...................... H04W 72/231 |

OTHER PUBLICATIONS

Partial International Search Report—PCT/US2024/039679—ISA/
EPO—Nov. 27, 2024.

* cited by examiner

1100

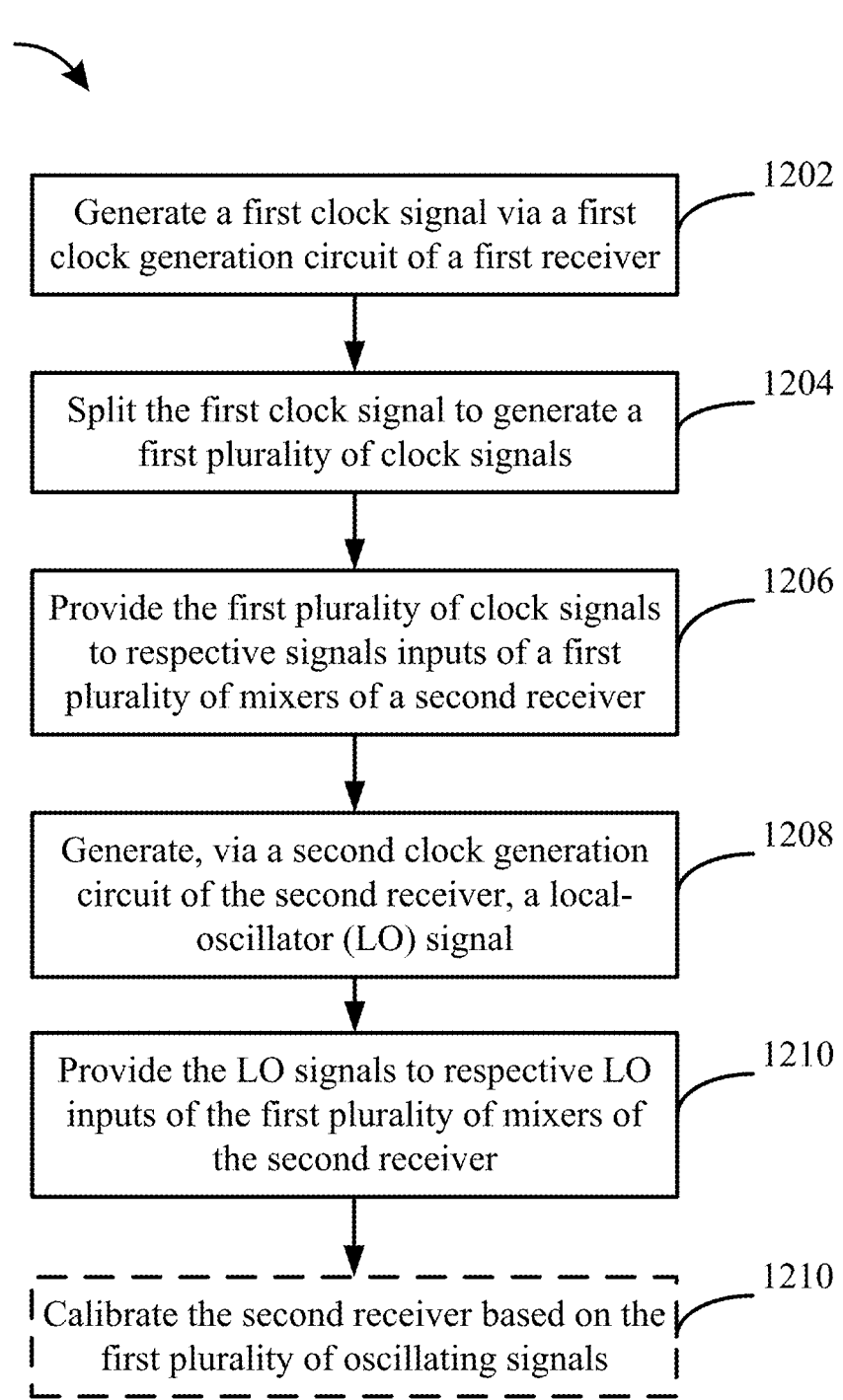

1200

Generate a first clock signal via a first clock generation circuit of a first receiver — 1202

Split the first clock signal to generate a first plurality of clock signals — 1204

Provide the first plurality of clock signals to respective signals inputs of a first plurality of mixers of a second receiver — 1206

Generate, via a second clock generation circuit of the second receiver, a local-oscillator (LO) signal — 1208

Provide the LO signals to respective LO inputs of the first plurality of mixers of the second receiver — 1210

Calibrate the second receiver based on the first plurality of oscillating signals — 1210

FIG. 12

CALIBRATION FOR A RECEIVER BY USING NEIGHBORING RECEIVE PATHS

CROSS-REFERENCE TO RELATED APPLICATION

The present application for patent claims the benefit of priority to U.S. Provisional Patent Appl. No. 63/516,376, filed Jul. 28, 2023, which is hereby incorporated by reference herein in its entirety.

BACKGROUND

Field of the Disclosure

Certain aspects of the present disclosure generally relate to electronic components and, more particularly, to techniques for calibrating a receiver.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include a transceiver for processing signals for reception or transmission. A transceiver may include one or more receive chains and one or more transmit chains. The one or more receive chains and/or the one or more transmit chains may include one or more oscillators and one or more amplifiers, for example. In some implementations, the one or more oscillators may include a phase-locked loop with a voltage-controlled oscillator (VCO) for generating an oscillating signal, which may be used for signal processing during signal transmission and reception.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards an apparatus. The apparatus generally includes: a first receiver having a first phase-locked loop (PLL), an output of the PLL being coupled to an input of a first splitter, wherein the first splitter has multiple outputs; a second receiver having a second PLL coupled to a local-oscillator (LO) input of each of a first plurality of mixers of the second receiver; and a signal path between each of the multiple outputs of the first splitter and an input of each of the first plurality of mixers.

Certain aspects of the present disclosure are directed towards an apparatus. The apparatus generally includes: a first receiver having a first oscillating signal generation circuit, an output of the first oscillating signal generation circuit being coupled to an input of a first splitter, wherein the first splitter has multiple outputs; a second receiver having a second oscillating signal generation circuit coupled to an LO input of each of a first plurality of mixers of the second receiver; and signal paths between the multiple outputs of the first splitter and signal inputs of the first plurality of mixers, respectively.

Certain aspects of the present disclosure are directed towards an apparatus for wireless communications. The apparatus generally includes: a first receiver having a first oscillating signal generation circuit selectively coupled to an LO input of each of one or more mixers of the first receiver chain and a second oscillating signal generation circuit selectively coupled to the LO input of each of the one or more mixers of the first receiver; a second receiver having a third oscillating signal generation circuit coupled to an LO input of each of one or more mixers of the second receiver; and a signal path selectively coupling an output of the first oscillating signal generation circuit to an input of the second receiver.

Certain aspects of the present disclosure are directed towards a method for receiver calibration. The method generally includes: generating a first oscillating signal via a first oscillating signal generation circuit of a first receiver; splitting the first oscillating signal to generate a first plurality of oscillating signals; providing the first plurality of oscillating signals to respective signal inputs of a first plurality of mixers of a second receiver; generating, via a second oscillating signal generation circuit of the second receiver, an LO signal; and providing the LO signals to respective LO inputs of the first plurality of mixers of the second receiver.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

FIG. 12 is a flow diagram illustrating example operations for receiver calibration, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure are directed towards apparatus and techniques for calibrating a receiver (RX). Certain aspects provide additional paths for calibration of a receive path using a neighboring RX path. For example, the neighboring RX path may include two high-power and low-power mode phase-locked loops (PLLs). The low-power mode PLL (e.g., implemented using a ring oscillator) may be used to generate oscillating signals to calibrate neighboring paths. In some aspects, a splitter may be coupled to the PLL and used to split an oscillating signal from the PLL to provide calibration signals or tones to different receive chains of a neighboring RX path. For instance, a first receiver may include a PLL with an output coupled to an input of a splitter. Outputs of the splitter may be coupled to inputs of respective mixers in a second receiver. The mixers of the second receiver may be driven by another PLL of the second receiver and used to down-convert signals from the splitter for calibrating the second receiver.

Example Wireless Communications

Figure 1:
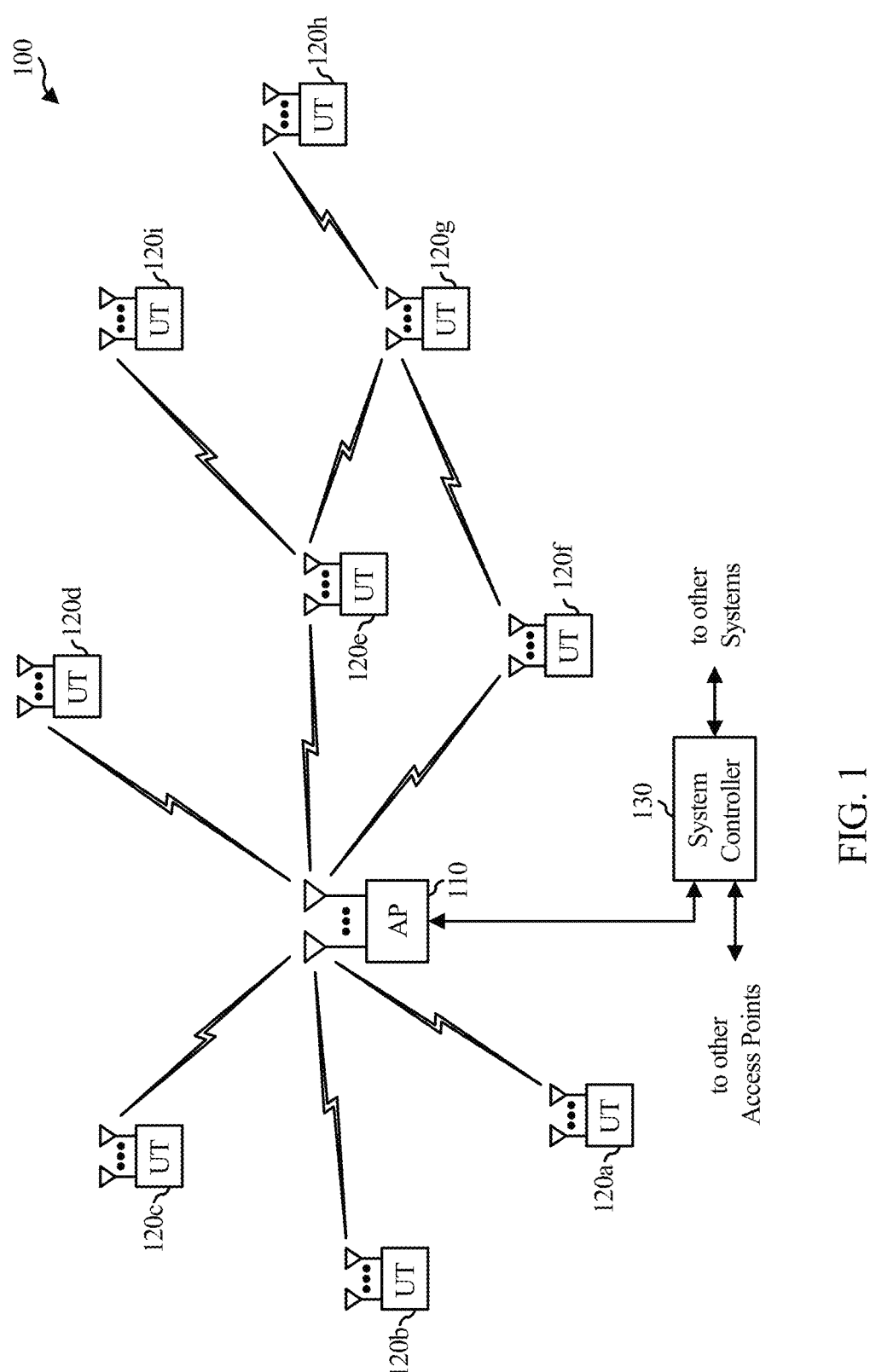
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \leq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). The user terminal 120 or the access point 110 may include receivers where one receiver may be used to generate signals for calibrating a neighboring receiver of the user terminal 120 or the access point 110, as described in more detail herein.

Figure 2:
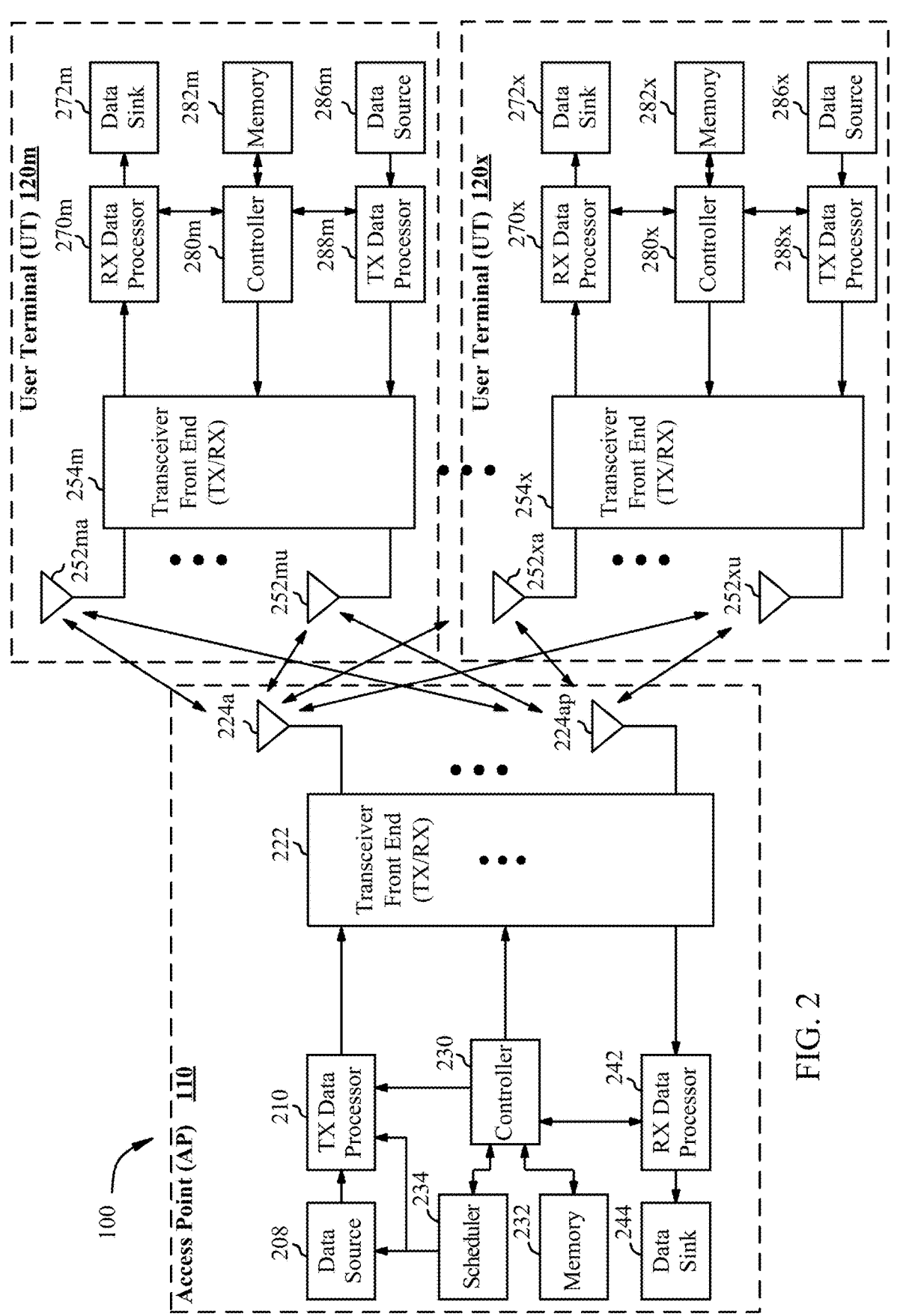
FIG. 2 is a block diagram of an example access point (AP) and example user terminals, in which aspects of the present disclosure may be practiced.

FIG. 2 shows a block diagram of access point 110 and two user terminals 120*m* and 120*x* in the wireless communications system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. Decoded data for each user terminal or access terminal may be provided to a data sink (e.g., data sink 244, data sink 272m, or data sink 272x) for storage and/or a controller for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 222 and/or the transceiver front end 254 may include multiple receivers. One receiver may be used to generate signals for calibrating a neighboring receiver of the transceiver front end 222 and/or the transceiver front end 254, as described in more detail herein.

Figure 3:
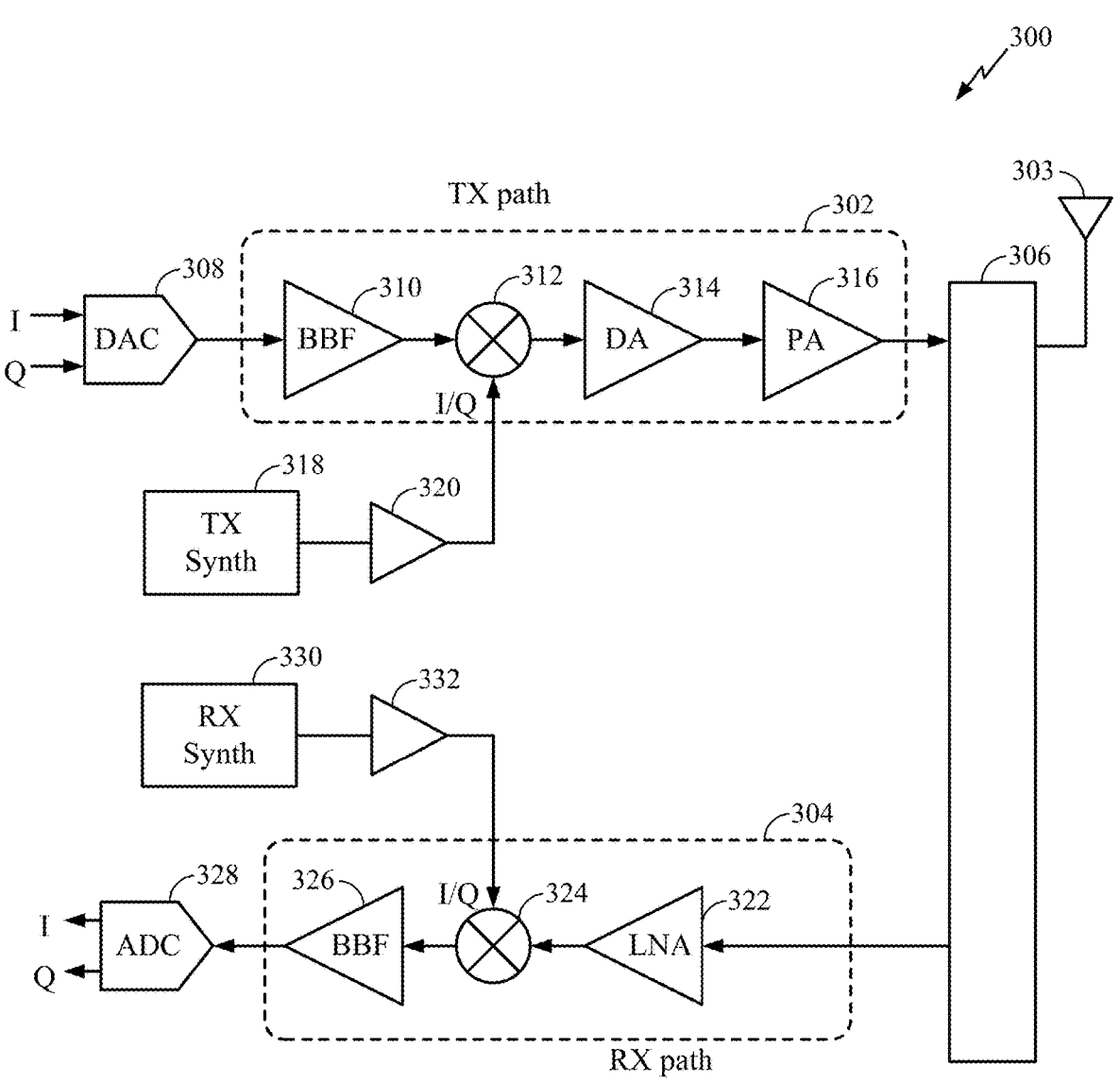
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a "transmit chain") for transmitting signals via one or more antennas and a receive (RX) path 304 (also known as a "receive chain") for receiving signals via the antennas. When the TX path 302 and the RX path 304 share an antenna 303, the paths may be connected with the antenna via an interface 306, which may include any of various suitable radio frequency (RF) devices, such as a switch, a duplexer, a diplexer, a multiplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC). In some cases, the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies of the LO frequency and the frequency of the signal of interest. The sum and difference frequencies are referred to as the "beat frequencies." The beat frequencies are typically in the RF range, such that the signals output by the mixer 312 are typically RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a received local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In some cases, a single frequency synthesizer may be used for both the TX path 302 and the RX path 304.

In some aspects, the transceiver front end 300 may include multiple RX paths such as the RX path 304. One RX path may be used to generate signals for calibrating a neighboring RX path, as described in more detail herein.

Example Techniques for Receive Path Calibration

Figure 6:
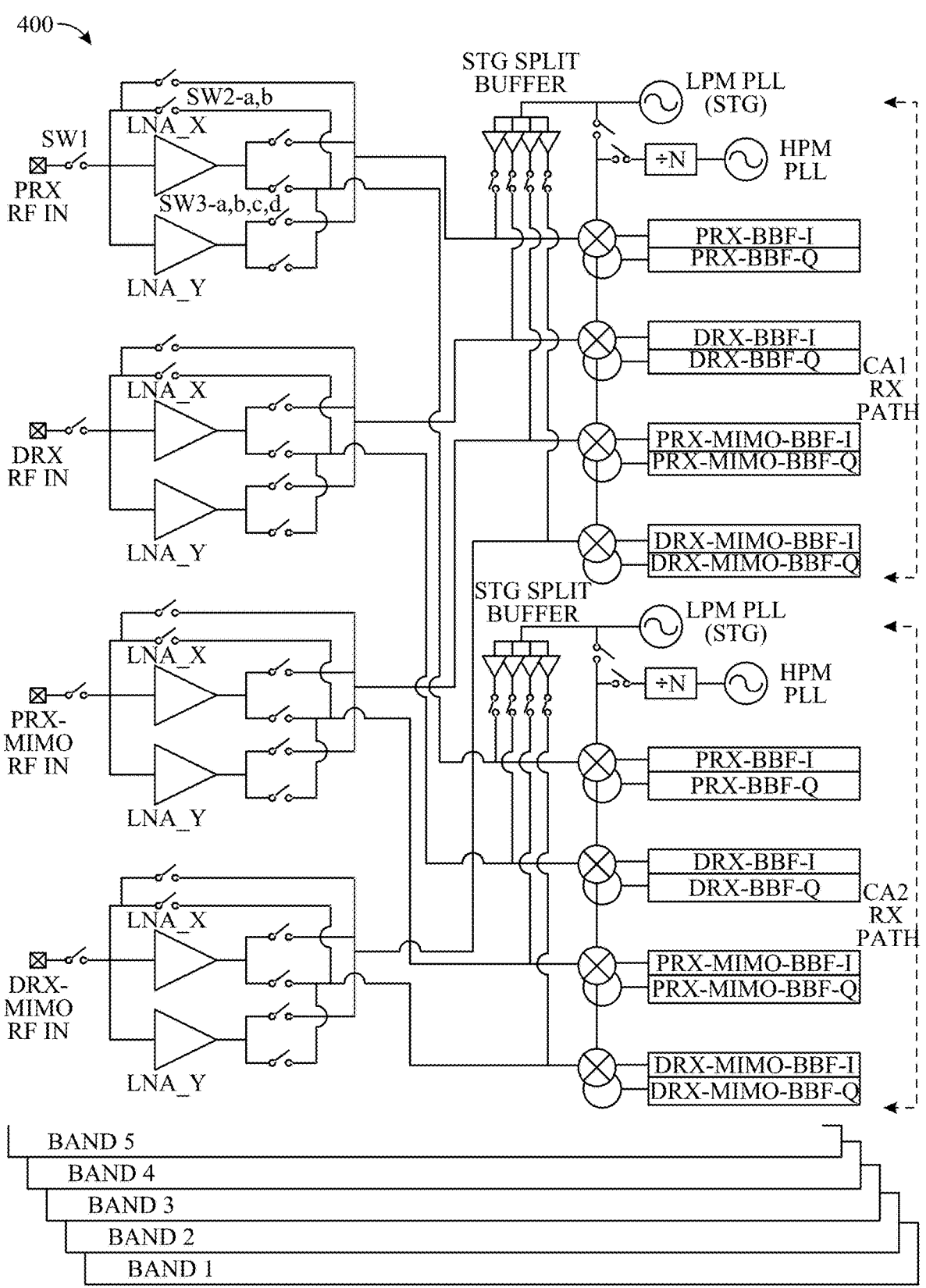
FIG. 6 illustrates the receive circuit of FIG. 4 and FIG. 5 implemented for each of multiple bands, in accordance with certain aspects of the present disclosure.

The number of receiver (RX) down-conversion pipes has increased for high data-rate and throughput by supporting carrier aggregation (CA), multiple-input multiple-output (MIMO), and increased frequency bands. Some radio frequency (RF) receivers may have many (e.g., forty) RX down-conversion pipes. For example, there may be five band groups, each having four MIMO pipes and 2 CA splits as shown in FIG. 6. With the higher number of RX down-conversion pipes, the RX calibration time for calibrating residual sideband (RSB) and second-order intermodulation by leaked transmit signals (TXIP2) is increased because each RX input port may use a driving signal for calibration. As a result, existing approaches using one input signal at a time for RX calibration become time-consuming and expensive to calibrate the increased number of RX down-conversion pipes. Calibration may involve using an external signal generator or transmitter (TX)-to-RX loop-back and may be performed for one RX path at a time. In addition, using a TX signal for RX calibration (TX-to-RX loop-back) may also cause coupling issues between the TX and RX.

Figure 4:
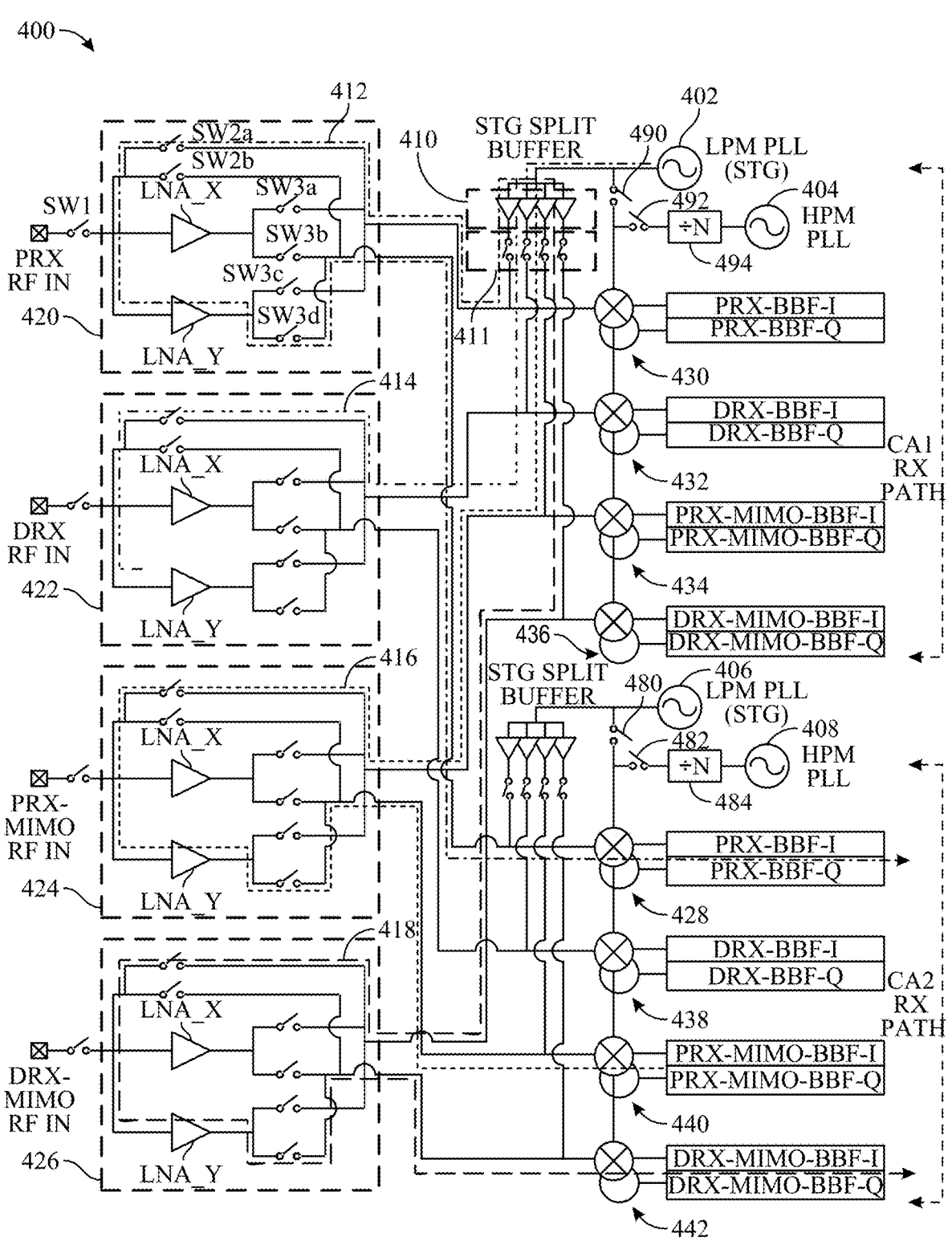
FIG. 4 and FIG. 5 illustrate example calibration operations using drive signals in a receive circuit for calibrating receiver (RX) down-conversion pipes using a neighboring RX path, in accordance with certain aspects of the present disclosure.
Figure 5:
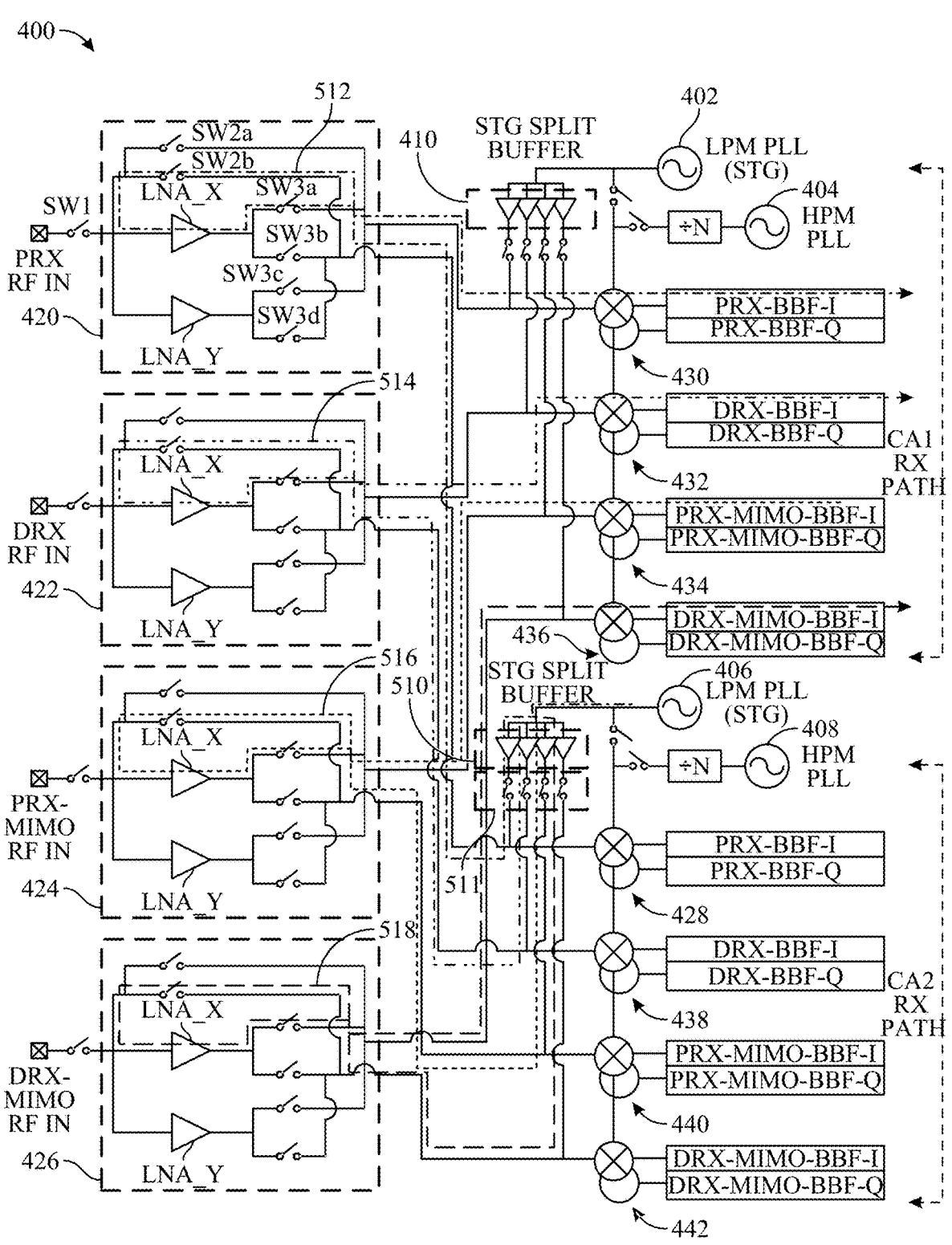

FIG. 4 and FIG. 5 illustrate example RSB calibration operations for a receive circuit 400, in accordance with certain aspects of the present disclosure. The receive circuit 400 may include a first CA path (labeled "CA1 RX path") and a second CA path (labeled "CA2 RX path). As shown in FIG. 4, the calibration operations may be performed to calibrate the RX down-conversion pipes of the second CA path using drive signals provided from the neighboring RX down-conversion pipes of the first CA path. As shown, the receive circuit 400 includes two phase-locked loops (PLLs) per CA RX path for primary (PRX), diversity (DRX), primary MIMO (PRXM), and diversity MIMO (DRXM) pipes. For example, PLLs 402, 404 may be used for reception via the CA1 RX path, and PLLs 406, 408 may be used for reception via the CA2 RX path. In some aspects, a frequency divider 494 may be coupled to an output of the PLL 404. The PLLs 402, 404 may be selectively coupled via switches 490, 492 to local oscillator (LO) inputs of mixers 430, 432, 434, 436.

The CA1 RX path may include a PRX pipe for processing a receive signal received via a PRX RF input (labeled "PRX RF in"), a DRX pipe for processing a receive signal received via a DRX RF input (labeled "DRX RF in"), PRXM pipe for processing a receive signal received via a PRX-MIMO RF input (labeled "PRX-MIMO RF in"), and a DRXM pipe for processing a receive signal received via a DRX MIMO RF input (labeled "DRX-MIMO RF in"). In CA operation, the CA2 RX path may also include a PRX pipe, a DRX pipe, a PRXM pipe, and a DRXM pipe sharing respective RF input ports with the CA1 RX path.

The PRX pipe may include a receive amplifier circuit 420 selectively coupled to in-phase (I) and quadrature (Q) mixers 430 and I and Q mixers 428 of the CA1 and CA2 RX paths, respectively. The PRX pipe may also include I and Q PRX BBFs (labeled "PRX-BBF-I" and "PRX-BBF-Q," which may be analogous to the BBF 326 of FIG. 3) for the CA1 and CA2 RX paths, as shown. Similarly, the DRX pipe may include a receive amplifier circuit 422 selectively coupled to the I and Q mixers 432 for the CA1 RX path, and the I and Q mixers 438 for the CA2 RX path. The DRX pipe may also include I and Q DRX BBFs (labeled "DRX-BBF-I" and "DRX-BBF-Q") for the CA1 and CA2 RX paths, as shown. The PRXM pipe may include a receive amplifier circuit 424 selectively coupled to the I and Q mixers 434 for the CA1 RX path, and the I and Q mixers 440 for the CA2 RX path. The PRXM pipe may also include I and Q PRx MIMO BBFs (labeled "PRX-MIMO-BBF-I" and "PRX-MIMO-BBF-Q") for the CA1 and CA2 RX paths, as shown. The DRXM pipe may include a receive amplifier circuit 426 selectively coupled to the I and Q mixers 436 for the CA1 RX path, and the I and Q mixers 442 for the CA2 RX path. The DRXM pipe may also include I and Q DRX MIMO BBFs (labeled "DRX-MIMO-BBF-I" and "DRX-MIMO-BBF-Q") for the CA1 and CA2 RX paths, as shown. Mixers 430, 432, 434, 436, 428, 438, 440, 442 may be implemented for respective down-conversion pipes to down-convert received signals and provide respective down-converted signals to respective BBFs.

In some aspects, the receive circuit 400 may include a high-power mode (HPM) PLL (e.g., PLL 404 and PLL 408) with a voltage-controlled oscillator (VCO) that may be implemented, for example, as an inductor-capacitor (LC) VCO and a low-power mode (LPM) PLL (e.g., PLL 402 and PLL 406) with a VCO that may be implemented, for example, as a ring VCO (although other VCO implementations may be possible), for each of the CA1 RX path and the CA2 RX path. During mission mode, the HPM PLL may be used to assist the receive circuit 400 to receive sensitive signals, while the LPM PLL may be used to assist the receive circuit 400 to receive strong signals reducing power consumption. The receive amplifier circuits 420, 422, 424, 426 may each include one or more low-noise amplifiers (LNAs) (analogous to LNA 322 of FIG. 3) with one or more bypass paths. For example, the amplifier circuit 420 may include an LNA (labeled "LNA_X") and an LNA (labeled "LNA_Y) having inputs selectively coupled to the PRX RF input (labeled "PRX RF in") via a switch SW1. The switch SW1 may be implemented as part of an input attenuator for mission mode, in some implementations. The output of LNA_X and LNA_Y of receive amplifier circuit 420 may be selectively coupled to mixers 430 of the CA1 RX path or the mixers 428 of the CA2 RX path via switches SW3a, SW3b, SW3c, and SW3d. The routings and switches SW3a, SW3b, SW3c, and SW3d may be used for carrier aggregation during mission mode. The receive amplifier circuit 420 may include bypass paths including respective switches SW2a and SW2b selectively coupling the inputs of the LNAs to the mixers 430 or the mixers 428, as shown, to optionally bypass the LNAs.

In some aspects of the present disclosure, the LPM PLL may be used as a signal source (e.g., as a single-tone generator (STG)) for RX calibration. In calibration mode, the LPM PLL (e.g., PLL 402) for the CA1 RX path may drive a STG split buffer 410, which splits a source signal from the LPM PLL into multiple paths (e.g., four paths for PRX, DRX, PRXM, and DRXM or two paths for PRX and DRX) and controls the signal amplitudes. For example, the PLL 402 may be used to generate a source signal that may be split via the buffer 410 into drive signals provided to the paths 412, 414, 416, 418. As shown, the buffer 410 may selectively provide drive signals to paths 412, 414, 416, 418 via switches 411, respectively. Using the STG split buffer 410, each of the drive signals is sent to PRX, DRX, PRXM, and DRXM LNAs, respectively, and then to the four down-conversion pipes in the neighboring CA2 RX path through respective mixers and filters (e.g., baseband filters (BBFs)), as shown. For example, the drive signal on path 412 may be sent to LNA_X and LNA_Y of receive amplifier circuit 420, then to mixers 428 and in-phase and quadrature PRx baseband filters labeled "PRX-BBF-I" and "PRX-BBF-Q." The four PRX, DRX, PRXM, and DRXM down-conversion pipes can be calibrated simultaneously. While the LPM PLL for the CA1 RX path is providing the driving signals on paths 412, 414, 416, 418 for calibration, the HPM PLL (e.g., PLL 408) (or LPM PLL such as PLL 406) for the CA2 RX path may generate an LO signal provided to LO inputs of mixers 428, 438, 440, 442 of the CA2 RX path, allowing the drive signals to be down-converted by the respective mixers 428, 438, 440, 442. As shown, a frequency divider 484 may be coupled to the output of the PLL 408. The PLL 408 and PLL 406 may be selectively coupled to the LO inputs of the mixers 428, 438, 440, 442 via switches 480, 482.

The down-converted drive signals from the mixers are then filtered via respective BBFs and converted from the analog domain to the digital domain via analog-to-digital converters (ADCs) (not shown, but analogous to the ADC 328 in FIG. 3). In the digital domain, the drive signals may be measured for calibration of the CA2 RX path. For example, gain and phase errors associated with I and Q signal constellations may be calibrated by offsetting the gain and phase errors of the I and Q signals for RSB calibration. For TXIP2 calibration, gate bias voltages of the mixers (e.g., mixers 428, 438, 440, 442 for the CA2 RX path) or BBF configurations may be adjusted to reduce the mismatch of differential signal paths, hence reducing the second-order intermodulation product caused by leaked TX signals.

As shown in FIG. 5, the calibration operations may be performed to calibrate the RX down-conversion pipes of the CA1 RX path using drive signals provided from the neighboring CA2 RX path. In other words, in FIG. 4, the PLL for the CA1 RX path is used as the signal source, and the CA2 RX path is the target RX path being calibrated. In FIG. 5, the PLL of the CA2 RX path is used as the signal source, and the CA1 RX path is the target RX path being calibrated. For example, the PLL 406 may generate a source signal that may be split via a STG split buffer 510 to provide drive signals to paths 512, 514, 516, 518 for calibration (e.g., reduction of mismatch of differential signal paths and RSB calibration). The buffer 510 may selectively provide the drive signals to paths 512, 514, 516, 518 via switches 511, respectively. The drive signal on path 512 may be provided to the input of LNA_X of the receive amplifier circuit 420, then to mixers 430 for down-conversion and to PRX-BBF-I and PRX-BBF-Q of the CA1 RX path for filtering. The filtered I and Q signals from PRX-BBF-I and PRX-BBF-Q may be converted from the analog domain to the digital domain and used for calibration of mixers 430 and RSB calibration for the CA1 RX path as described.

In the example calibration operations described with respect to FIG. 4 and FIG. 5, four RX down-conversion pipes for one band are calibrated at the same time. In other words, the down-conversion pipes including mixers 428, 438, 440, 442 are calibrated at the same time, and the down-conversion pipes including mixers 430, 432, 434, 436 are calibrated at the same time. As shown in FIG. 6, the receive circuit 400 may be implemented for different bands labeled "Band 1" to "Band 5." The different bands may include, for example, a low-band (LB), a mid-band (MB), or a high-band (HB) to name a few. The RX paths of the receive circuits for the different bands may be calibrated simultaneously. For example, half of the RX down-conversion pipes of each of the receive circuits for the different bands (e.g., including receive circuit 400 for Band 5) may be calibrated simultaneously, followed by the other half of the RX down-conversion pipes using the operations described with respect to FIG. 4 and FIG. 5. In an example RF receiver having a total of forty RX down-conversion pipes, twenty RX down-conversion pipes may be calibrated at the same time, resulting in a reduction of calibration time and cost savings as compared to some conventional implementations. For example, as described with respect to FIG. 5, an RX path (e.g., the CA2 RX path) may be used to provide a tone as an input to a neighboring RX path (e.g., the CA1 RX path). The tone may be down-converted and processed in the digital domain to adjust a configuration of one or more components of the neighboring RX path (e.g., offset the gain/phase errors, adjust bias of one or more mixers, or adjust BBF configuration(s)).

Figure 7:
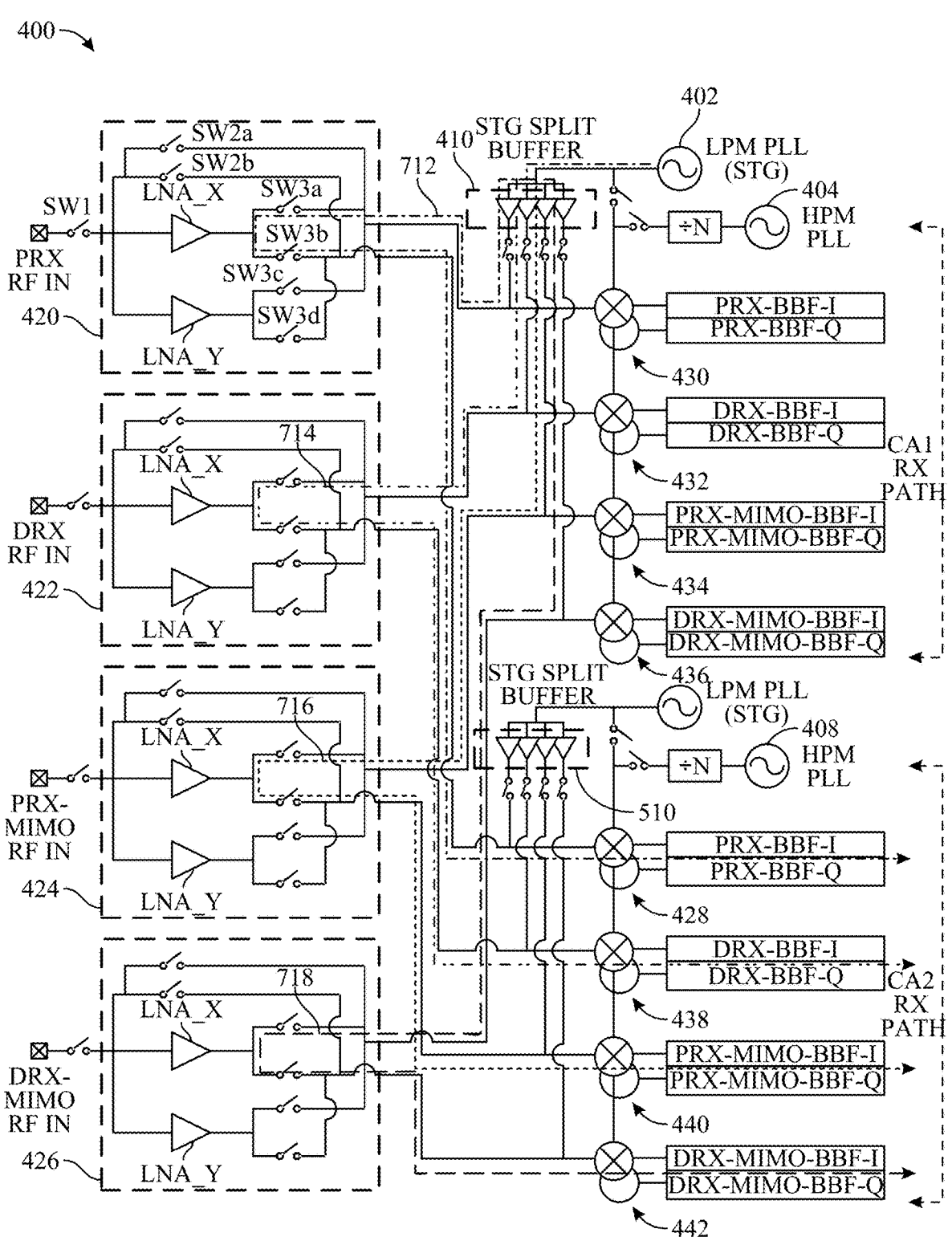
FIG. 7 and FIG. 8 illustrate example calibration operations using drive signals in a receive circuit for calibrating RX down-conversion pipes with a neighboring RX path without using a low-noise amplifier (LNA), in accordance with certain aspects of the present disclosure.
Figure 8:
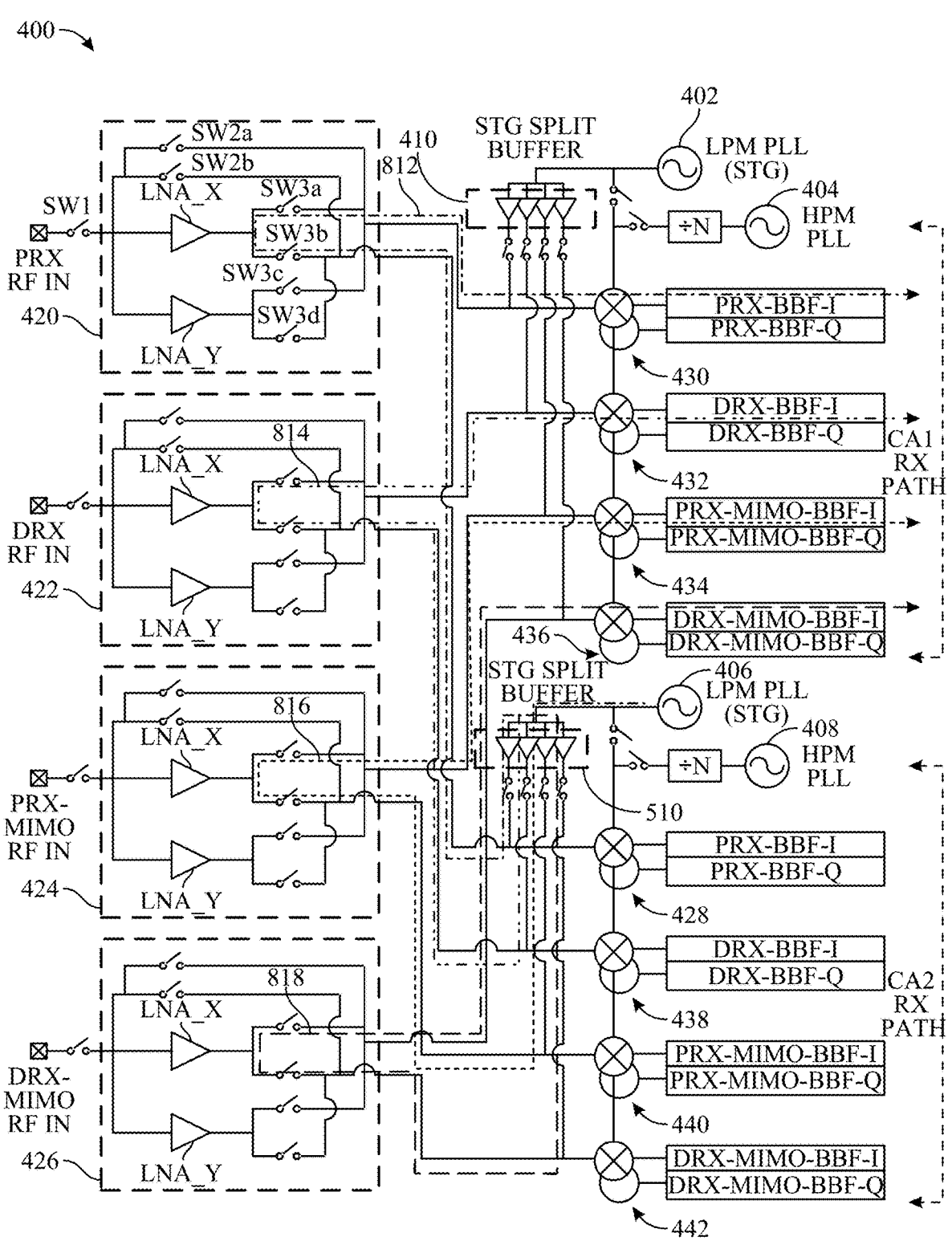

FIG. 7 and FIG. 8 illustrate example RSB calibration operations for the receive circuit 400 without using LNAs, in accordance with certain aspects of the present disclosure. As shown in FIG. 7, the calibration operations may be performed to calibrate the RX down-conversion pipes of the CA2 RX path using drive signals provided from the neighboring CA1 RX path. Instead of the drive signals being routed through LNAs as shown in FIG. 4 and FIG. 5, the drive signals may bypass the LNAs via paths 712, 714, 716, 718, as shown. For example, the switches SW3*a* and SW3*b* of the receive amplifier circuit 420 may be closed. A drive signal from the buffer 410 may be provided, via path 712, across switches SW3*a* and SW3*b* and to the mixers 428 for down-conversion and processing for calibration. Thus, the drive signals from the STG split buffer 410 directly drive the mixers and baseband filters (e.g., BBFs for the CA2 RX path), and calibration can be performed to obtain gain and phase errors of I and Q signals. The drive signals may be provided from an RX path (e.g., the CA1 RX path) to a neighboring RX path (e.g., the CA2 RX path) to be used for calibration. As described, the drive signals may be down-converted by the neighboring RX path and processed in the digital domain to adjust a configuration of one or more components of the neighboring RX path. Similarly, as shown in FIG. 8, the calibration operations may be performed to calibrate the RX down-conversion pipes of the CA1 RX path using drive signals provided from the neighboring CA2 RX path without using an LNA. For example, the PLL 406 may generate a source signal that may be split via the STG split buffer 510 to provide drive signals to paths 812, 814, 816, 818 for calibration (e.g., reduction of mismatch of differential signal paths and RSB calibration).

Figure 9:
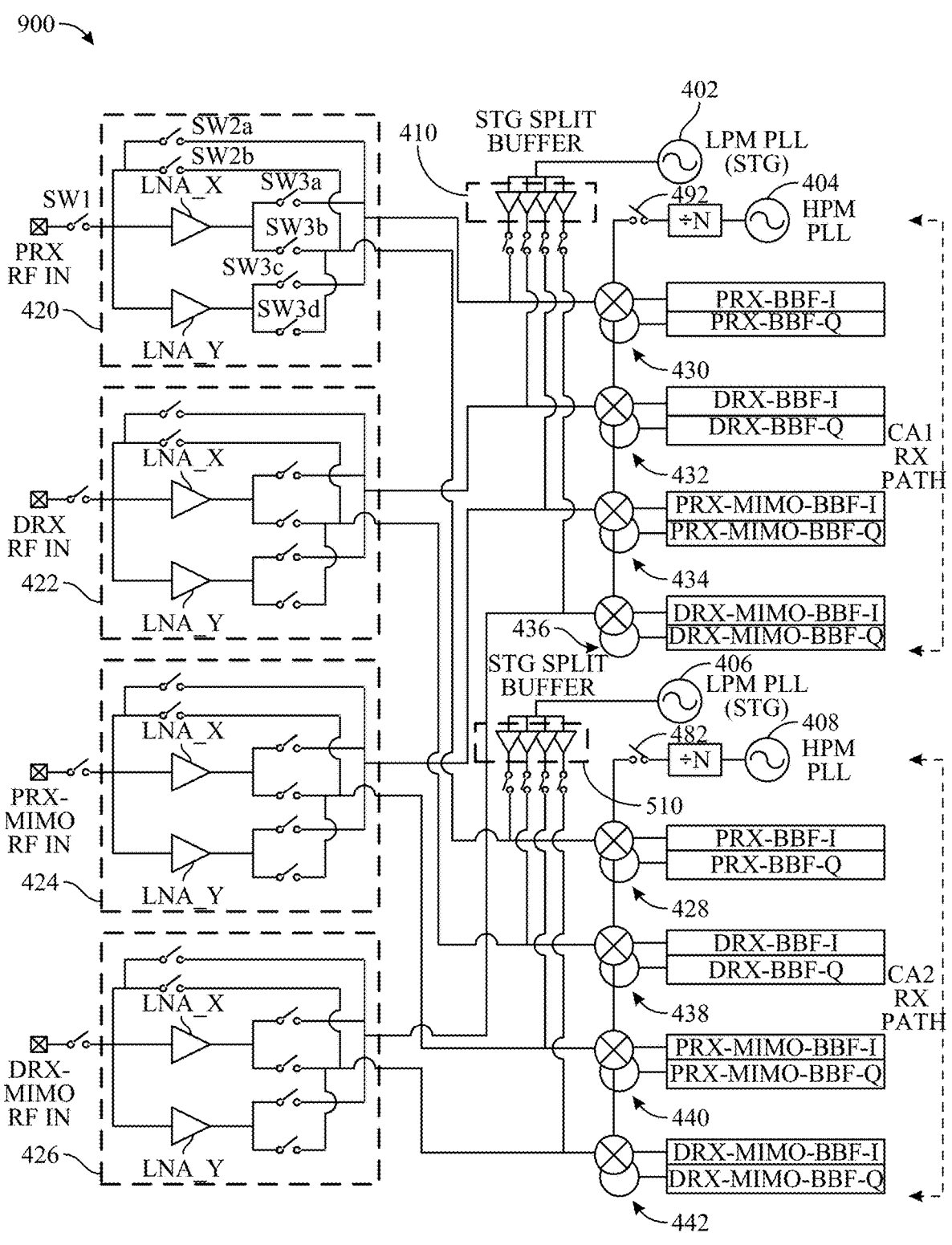
FIG. 9 illustrates a receive circuit having a low-power mode (LPM) phase-locked loop (PLL) dedicated to performing calibration, in accordance with certain aspects of the present disclosure.

FIG. 9 illustrates a receive circuit 900 having an LPM PLL dedicated to performing calibration, in accordance with certain aspects of the present disclosure. In other words, while receive circuit 400 may use either the LPM PLL or the HPM PLL to generate LO signals for mixers, the LPM PLL (e.g., PLL 402) of receive circuit 900 is dedicated for generating drive signals for calibration, while the HPM PLL (e.g., PLL 404) of receive circuit 900 may be used for generating the LO signal for mixers to perform down-conversion. As shown, the PLL 404 may be selectively coupled to the LO inputs of mixers 430, 432, 434, 436 via switch 492, and the PLL 408 may be selectively coupled to the LO inputs of mixers 428, 438, 440, 442 via switch 482.

Figure 10:
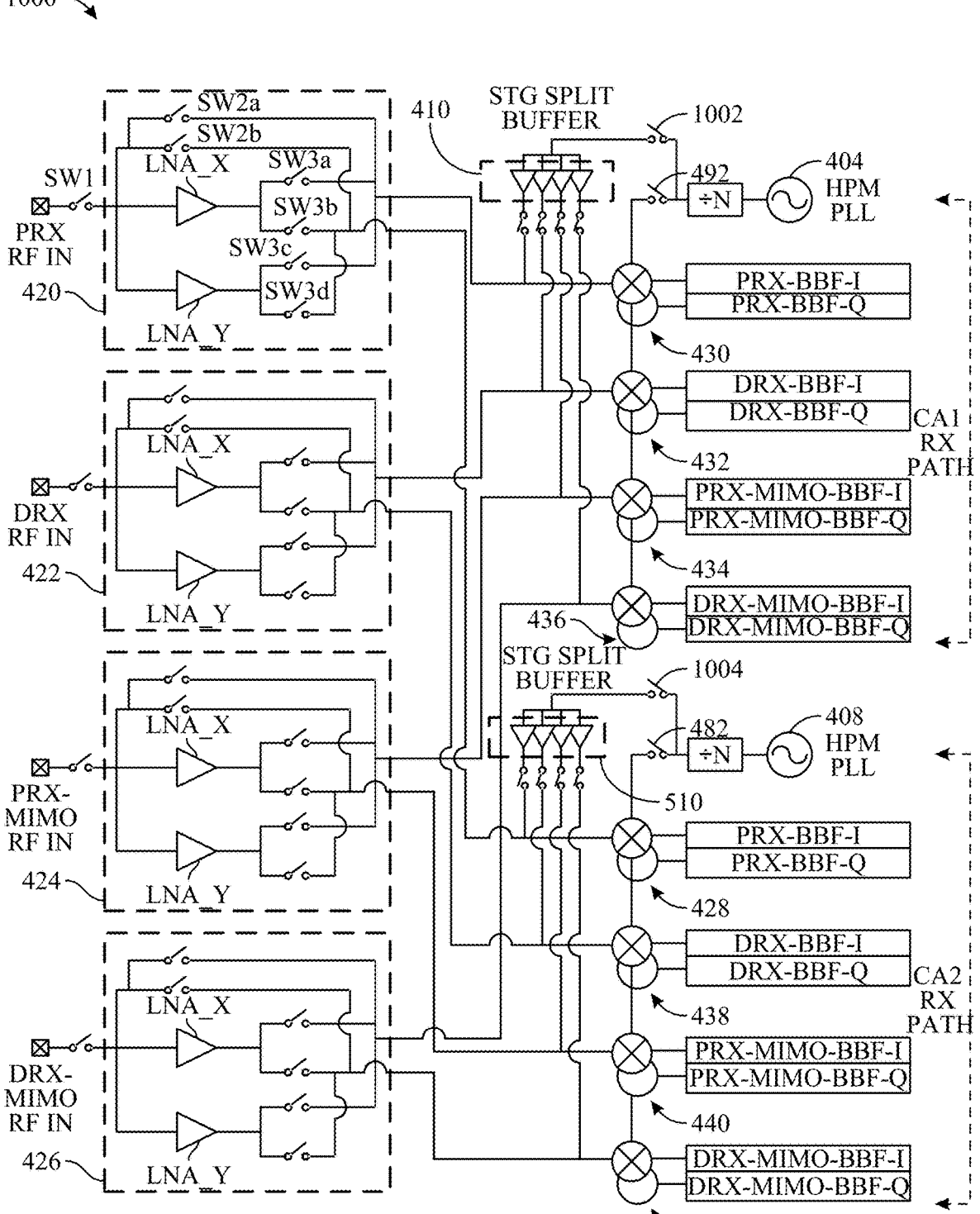
FIG. 10 illustrates a receive circuit implemented without an LPM PLL, in accordance with certain aspects of the present disclosure.

FIG. 10 illustrates a receive circuit 1000 implemented without an LPM PLL, in accordance with certain aspects of the present disclosure. As shown, the HPM PLL (e.g., PLL 404) may be selectively coupled to the buffer 410 or LO inputs of mixers 430, 432, 434, 436 via respective switches 1002, 492. Similarly, the HPM PLL (e.g., PLL 408) may be selectively coupled to the buffer 510 or LO inputs of mixers 428, 438, 440, 442 via respective switches 1004, 482. In this case, the drive signals for calibration may be generated by the HPM PLL (e.g., PLL 404) for the CA1 RX path for calibrating the CA2 RX path, while the HPM PLL (e.g., PLL 408) for the CA2 RX path generates the LO signal for mixers 428, 438, 440, 442 of the CA2 RX path. Similarly, the drive signals for calibrating the CA1 RX path may be generated by the HPM PLL (e.g., PLL 408) of the CA2 RX path, while the HPM PLL (e.g., PLL 404) for the CA1 RX path generates the LO signal for mixers 430, 432, 434, 436 of the CA1 RX path. In other words, the HPM PLL for each CA RX path is used as an LO source in RX mission mode and may also be used as a signal source for calibrating a neighboring RX path in calibration mode.

Figure 11:
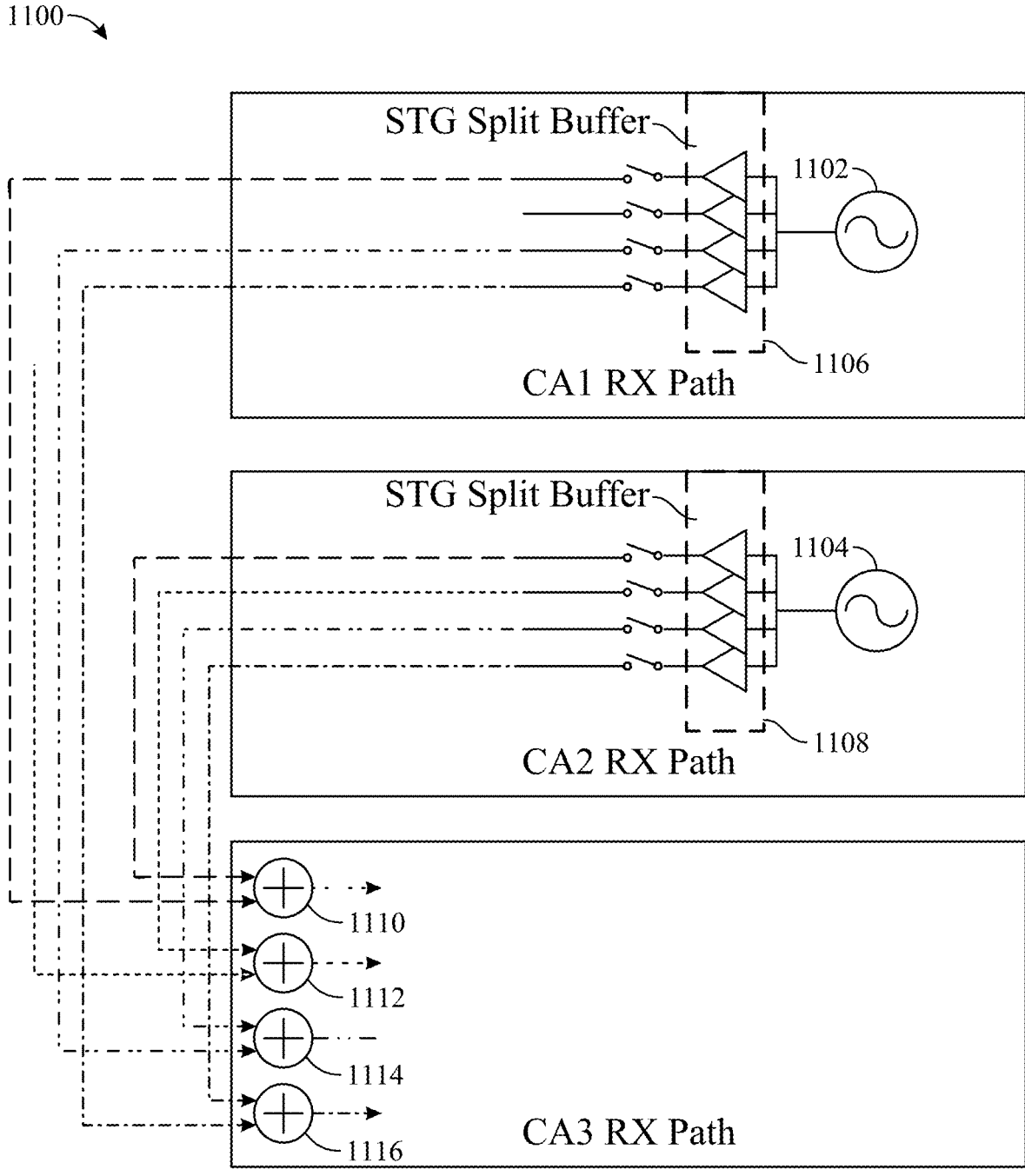
FIG. 11 illustrates receiver paths for calibrating an inter-modulation product, in accordance with certain aspects of the present disclosure.

FIG. 11 illustrates a receive circuit 1100 including RX paths for calibrating TXIP2, in accordance with certain aspects of the present disclosure. To calibrate TXIP2 (e.g., second-order intermodulation by leaked TX signals), two tones may be generated. The two tones may be generated by using two neighboring RX paths as signal sources. For instance, as shown, a PLL 1102 (e.g., LPM PLL or HPM PLL) of the CA1 RX path and a PLL 1104 of the CA2 RX path may be used to generate drive signals which are split via respective buffers 1106, 1108 as shown. The drive signals may be combined using combiners 1110, 1112, 1114, 1116 for a CA3 RX path to generate two-tone signals to be used for calibrating TXIP2. For example, the two-tone signals generated via combiners 1110, 1112, 1114, 1116 may be provided to respective mixers 428, 438, 440, 442 for calibration as described herein. The calibration approach may be similar to the approach described with respect to FIGS. 4-10, but with the drive signals from two CA RX paths being provided to a third CA RX path and combined for TXIP2 calibration.

Certain aspects of the present disclosure may reduce coupling between source and target RX paths that would otherwise reduce the accuracy of calibration. That is, RX calibration may be less accurate if there is a frequency component that is generated by a coupling mechanism and falls at the same frequency being measured in calibration. For example, if a LPM PLL and a HPM PLL in the same RX path are used to generate drive signals and LO signals for mixers, respectively, couplings between the PLLs in the same RX path may make RSB calibration difficult. Certain aspects of the present disclosure reduce the coupling between the signals generated by the RX paths during calibration since the calibration techniques described herein use drive signals generated via a PLL for one RX path to calibrate a neighboring RX path.

Certain aspects of the present disclosure enable RX calibration in PRX, DRX, PRXM, and DRXM RX down-conversion pipes simultaneously. Certain aspects enable the calibration of multiple bands at the same time, allowing half of the total RX paths across different bands to be calibrated simultaneously, achieving time and cost savings for RX calibration.

FIG. 12 is a flow diagram illustrating example operations 1200 for receiver calibration, in accordance with certain aspects of the present disclosure. The operations 1200 may be performed, for example, by a receive circuit such as the receive circuit 400, the receive circuit 900, the receive circuit 1000, or the receive circuit 1100.

At block 1202, the receive circuit may generate a first oscillating signal via a first oscillating signal generation circuit (e.g., via PLL 402 or PLL 404) of a first receiver (e.g., the CA1 RX path). At block 1204, the receive circuit may split (e.g., via buffer 410 of FIG. 4) the first oscillating signal to generate a first plurality of oscillating signals (e.g., also referred to herein as "drive signals" or "calibration signals"). At block 1206, the receive circuit may provide the first plurality of oscillating signals to respective signal inputs of a first plurality of mixers (e.g., mixers 428, 438, 440, 442) of a second receiver (e.g., the CA2 RX path). At block 1208, the receive circuit may generate, via a second oscillating signal generation circuit (e.g., PLL 406 or PLL 408) of the second receiver, an LO signal. At block 1210, the receive circuit may provide the LO signal to respective LO inputs of the first plurality of mixers of the second receiver. In some aspects, at block 1212, the second receiver may be calibrated based on the first plurality of oscillating signals.

In some aspects, the receive circuit may down-convert the first plurality of oscillating signals via the first plurality of mixers to yield down-converted signals. The receive circuit may process the down-converted signals for calibration and configure one or more components of the second receiver based on the processing.

In some aspects, the receive circuit may generate a second oscillating signal via a second oscillating signal generation circuit of the second receiver, and split the second oscillating signal to generate a second plurality of oscillating signals. In some aspects, the receive circuit may provide the second plurality of oscillating signals to respective signal inputs of a second plurality of mixers of the first receiver. The receive circuit may generate a second local-oscillator (LO) signal and provide the second LO signals to respective LO inputs of the second plurality of mixers. In some aspects, the second LO signal may be generated via the first oscillating signal generation circuit of the first receiver.

In some aspects, the receive circuit may generate a second oscillating signal via a third oscillating signal generation circuit of a third receiver (e.g., the CA2 RX path of FIG. 11). The receive circuit may split the second oscillating signal to generate a second plurality of oscillating signals and combine (e.g., via combiners 1110, 1112, 1114, 1116) the first plurality of oscillating signals with the second plurality of oscillating signals to generate a plurality of combined signals, respectively. Providing the first plurality of oscillating signals to the respective signal inputs of the first plurality of mixers may include providing the plurality of combined signals to the respective signal inputs of the first plurality of mixers.

EXAMPLE ASPECTS

In addition to the various aspects described above, specific combinations of aspects are within the scope of the disclosure, some of which are detailed below:

Aspect 1: An apparatus for receiver calibration, comprising: a first receiver having a first phase-locked loop (PLL), an output of the first PLL being coupled to an input of a first splitter, wherein the first splitter has multiple outputs; a second receiver having a second PLL coupled to a local-oscillator (LO) input of each of a first plurality of mixers of the second receiver; and a signal path between each of the multiple outputs of the first splitter and a signal input of each of the first plurality of mixers.

Aspect 2: The apparatus of Aspect 1, wherein: the first PLL is configured to generate an oscillating signal; and the first splitter is configured to split the oscillating signal to generate multiple calibration signals, the multiple calibration signals being provided, via the signal paths, to the signal inputs of the first plurality of mixers for calibrating the second receiver.

Aspect 3: The apparatus of Aspect 2, wherein the multiple calibration signals are provided to the signal inputs of the first plurality of mixers through respective amplifiers.

Aspect 4: The apparatus according to any of Aspects 1-3, wherein: the first PLL is a low-power mode (LPM) PLL or a high-power mode (HPM) PLL; and the second PLL is a LPM PLL or an HPM PLL.

Aspect 5: The apparatus according to any of Aspects 1-4, further comprising a third receiver having a third phase-locked loop (PLL), an output of the third PLL being coupled to an input of a second splitter, wherein: the second splitter has multiple outputs; and the second receiver comprises a plurality of combiners having first inputs coupled to the multiple outputs of the first splitter, respectively, and having second inputs coupled to the multiple outputs of the second splitter, respectively.

Aspect 6: The apparatus of Aspect 5, wherein a combined output signal of the plurality of combiners is configured to be used for calibrating the second receiver.

Aspect 7: A wireless communications apparatus, comprising: a first receiver chain having a first oscillating signal generation circuit selectively coupled to an LO input of one or more mixers of the first receiver chain and a second oscillating signal generation circuit selectively coupled to the LO input of the one or more mixers of the first receiver chain; a second receiver chain having a third oscillating signal generation circuit coupled to an LO input of one or more mixers of the second receiver chain; and a signal path selectively coupling an output of the first oscillating signal generation circuit to an input of the second receiver chain.

Aspect 8: The apparatus of Aspect 7, wherein: the first oscillating signal generation circuit comprises a low-power mode (LPM) PLL; and the second oscillating signal generation circuit comprises a high-power mode (HPM) PLL.

Aspect 9: The apparatus of Aspect 7 or 8, wherein the signal path comprises a splitter comprising multiple buffers and having a plurality of outputs coupling the output of the first oscillating signal generation circuit to an input of a plurality of receiver chains including the second receiver chain.

Aspect 10: The apparatus according to any of Aspects 7-9, wherein the input of the second receiver chain is at least one of: between an LNA and a signal input of the one or more mixers of the second receiver chain; or between an antenna and an LNA of the second receiver chain.

Aspect 11: The apparatus according to any of Aspects 7-10, wherein the first receiver chain is configured for processing signals within a first band of a carrier aggregation band combination, and wherein the second receiver chain is configured for processing signals within a second band of the carrier aggregation band combination.

Aspect 12: The apparatus according to any of Aspects 7-11, further comprising a data processing circuit configured to process an output signal of the second receiver chain in response to a signal output by the first oscillating signal generation circuit being fed through the input of the second receiver chain.

Aspect 13: The apparatus of Aspect 12, wherein the data processing circuit is configured to calibrate one or more characteristics of the second receiver chain based on the processing of the output signal.

Aspect 14: An apparatus comprising: a first receiver having a first oscillating signal generation circuit, an output of the first oscillating signal generation circuit being coupled to an input of a first splitter, wherein the first splitter has multiple outputs; a second receiver having a second oscillating signal generation circuit coupled to a local-oscillator (LO) input of each of a first plurality of mixers of the second receiver; and signal paths between the multiple outputs of the first splitter and signal inputs of the first plurality of mixers, respectively.

Aspect 15: The apparatus of Aspect 14, wherein the first oscillating signal generation circuit comprises a first phase-locked loop (PLL), and wherein the second oscillating signal generation circuit comprises a second PLL.

Aspect 16: The apparatus of Aspect 14 or 15, wherein: the first oscillating signal generation circuit is configured to generate an oscillating signal; and the first splitter is configured to split the oscillating signal to generate multiple calibration signals to be provided, via the signal paths, to the signal inputs of the first plurality of mixers for calibrating the second receiver.

Aspect 17: The apparatus of Aspect 16, wherein the signal paths are configured to provide the multiple calibration signals to the signal inputs of the first plurality of mixers through respective amplifiers.

Aspect 18: The apparatus of Aspect 17, wherein the respective amplifiers comprise low-noise amplifiers (LNAs) of respective receive chains of the first receiver.

Aspect 19: The apparatus of Aspect 17 or 18, wherein: the first receiver comprises multiple amplifiers, each amplifier of the multiple amplifiers being coupled to switches configured to selectively couple the amplifier to a receive chain of the first receiver and a receive chain of the second receiver for carrier aggregation; and the signal paths are configured to provide the calibration signals to the signal inputs of the first plurality of mixers via the switches.

Aspect 20: The apparatus according to any of Aspects 14-19, further comprising a third receiver having a third oscillating signal generation circuit, an output of the third oscillating signal generation circuit being coupled to an input of a second splitter, wherein: the second splitter has multiple outputs; and the second receiver comprises a plurality of combiners having first inputs coupled to the multiple outputs of the first splitter, respectively, and having second inputs coupled to the multiple outputs of the second splitter, respectively.

Aspect 21: An apparatus for wireless communications, comprising: a first receiver having a first oscillating signal generation circuit selectively coupled to a local-oscillator (LO) input of each of one or more mixers of the first receiver and a second oscillating signal generation circuit selectively coupled to the LO input of each of the one or more mixers of the first receiver; a second receiver having a third oscillating signal generation circuit coupled to an LO input of each of one or more mixers of the second receiver; and a signal path selectively coupling an output of the first oscillating signal generation circuit to an input of the second receiver.

Aspect 22: The apparatus of Aspect 21, wherein: the first oscillating signal generation circuit comprises a low-power mode (LPM) PLL; and the second oscillating signal generation circuit comprises a high-power mode (HPM) PLL.

Aspect 23: The apparatus of Aspect 21 or 22, wherein the signal path comprises a splitter comprising multiple buffers and having a plurality of outputs coupling the output of the first oscillating signal generation circuit to an input of each of a plurality of receiver chains of the second receiver.

Aspect 24: The apparatus according to any of Aspects 21-23, wherein the input of the second receiver is at least one of: between an amplifier and a signal input of the one or more mixers of the second receiver; or between an antenna and the amplifier of the second receiver.

Aspect 25: The apparatus according to any of Aspects 21-24, wherein the first receiver is configured for processing signals within a first band of a carrier aggregation band combination, and wherein the second receiver is configured for processing signals within a second band of the carrier aggregation band combination.

Aspect 26: The apparatus according to any of Aspects 21-25, further comprising a data processing circuit configured to process an output signal of the second receiver in response to a signal output by the first oscillating signal generation circuit being fed through the input of the second receiver.

Aspect 27: The apparatus of Aspect 26, wherein the data processing circuit is configured to calibrate one or more characteristics of the second receiver based on the processing of the output signal.

Aspect 28: A method for receiver calibration, comprising: generating a first oscillating signal via a first oscillating signal generation circuit of a first receiver; splitting the first oscillating signal to generate a first plurality of oscillating signals; providing the first plurality of oscillating signals to respective signal inputs of a first plurality of mixers of a second receiver; generating, via a second oscillating signal generation circuit of the second receiver, a local-oscillator (LO) signal; and providing the LO signals to respective LO inputs of the first plurality of mixers of the second receiver.

Aspect 29: The method of Aspect 28, further comprising down-converting the first plurality of oscillating signals via the first plurality of mixers to yield down-converted signals; processing the down-converted signals for calibration; and configuring one or more components of the second receiver based on the processing.

Aspect 30: The method of Aspect 28 or 29, wherein: the first oscillating signal generation circuit comprises a first phase-locked loop (PLL); and the second oscillating signal generation circuit comprises a second PLL.

Aspect 31: The method according to any of Aspects 28-30, further comprising generating a second oscillating signal via the second oscillating signal generation circuit of the second receiver; splitting the second oscillating signal to generate a second plurality of oscillating signals; providing the second plurality of oscillating signals to respective signal inputs of a second plurality of mixers of the first receiver; generating a second local-oscillator (LO) signal; and providing the second LO signal to respective LO inputs of the second plurality of mixers.

Aspect 32: The method of Aspect 31, wherein the second LO signal is generated via the first oscillating signal generation circuit of the first receiver.

Aspect 33: The method according to any of Aspects 28-32, further comprising generating a second oscillating signal via a third oscillating signal generation circuit of a third receiver; splitting the second oscillating signal to generate a second plurality of oscillating signals; and combining the first plurality of oscillating signals with the second plurality of oscillating signals to generate a plurality of combined signals, respectively, wherein providing the first plurality of oscillating signals to the respective signal inputs of the first plurality of mixers comprises providing the plurality of combined signals to the respective signal inputs of the first plurality of mixers.

ADDITIONAL CONSIDERATIONS

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The apparatus and methods described in the detailed description are illustrated in the accompanying drawings by various blocks, modules, components, circuits, steps, processes, algorithms, etc. (collectively referred to as "elements"). The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An apparatus comprising:

a first receiver having a mixer with a local-oscillator (LO) input and a first oscillating signal generation circuit, an output of the first oscillating signal generation circuit selectively coupled to the LO input of the mixer and an input of a first splitter, wherein the first splitter has multiple outputs;

a second receiver having a second oscillating signal generation circuit coupled to a local-oscillator (LO) input of each of a first plurality of mixers of the second receiver; and signal paths between the multiple outputs of the first splitter and signal inputs of the first plurality of mixers, respectively.

2. The apparatus of claim 1, wherein the first oscillating signal generation circuit comprises a first phase-locked loop (PLL), and wherein the second oscillating signal generation circuit comprises a second PLL.

3. The apparatus of claim 1, wherein:

the first oscillating signal generation circuit is configured to generate an oscillating signal; and the first splitter is configured to split the oscillating signal to generate multiple calibration signals to be provided, via the signal paths, to the signal inputs of the first plurality of mixers for calibrating the second receiver.

4. The apparatus of claim 3, wherein the signal paths are configured to provide the multiple calibration signals to the signal inputs of the first plurality of mixers through respective amplifiers.

5. The apparatus of claim 4, wherein the respective amplifiers comprise low-noise amplifiers (LNAs) of respective receive chains of the first receiver.

6. The apparatus of claim 4, wherein:

the first receiver comprises multiple amplifiers, each amplifier of the multiple amplifiers being coupled to switches configured to selectively couple the amplifier to a receive chain of the first receiver and a receive chain of the second receiver for carrier aggregation; and the signal paths are configured to provide the calibration signals to the signal inputs of the first plurality of mixers via the switches.

7. The apparatus of claim 1, further comprising a third receiver having a third oscillating signal generation circuit, an output of the third oscillating signal generation circuit being coupled to an input of a second splitter, wherein:

the second splitter has multiple outputs; and the second receiver comprises a plurality of combiners having first inputs coupled to the multiple outputs of the first splitter, respectively, and having second inputs coupled to the multiple outputs of the second splitter, respectively.

8. The apparatus of claim 1, wherein the first receiver further comprises an LNA coupled to a signal input of the mixer of the first receiver.

9. An apparatus for wireless communications, comprising:

a first receiver having a first oscillating signal generation circuit selectively coupled to a local-oscillator (LO) input of each of one or more mixers of the first receiver and a second oscillating signal generation circuit selectively coupled to the LO input of each of the one or more mixers of the first receiver;

a second receiver having a third oscillating signal generation circuit coupled to an LO input of each of one or more mixers of the second receiver; and a signal path selectively coupling an output of the first oscillating signal generation circuit to an input of the second receiver.

10. The apparatus of claim 9, wherein:

the first oscillating signal generation circuit comprises a low-power mode (LPM) PLL; and the second oscillating signal generation circuit comprises a high-power mode (HPM) PLL.

11. The apparatus of claim 9, wherein the signal path comprises a splitter comprising multiple buffers and having a plurality of outputs coupling the output of the first oscillating signal generation circuit to an input of each of a plurality of receiver chains of the second receiver.

12. The apparatus of claim 9, wherein the input of the second receiver is at least one of:

between an amplifier and a signal input of the one or more mixers of the second receiver; or between an antenna and the amplifier of the second receiver.

13. The apparatus of claim 9, wherein the first receiver is configured for processing signals within a first band of a carrier aggregation band combination, and wherein the second receiver is configured for processing signals within a second band of the carrier aggregation band combination.

14. The apparatus of claim 9, further comprising a data processing circuit configured to process an output signal of the second receiver in response to a signal output by the first oscillating signal generation circuit being fed through the input of the second receiver.

15. The apparatus of claim 14, wherein the data processing circuit is configured to calibrate one or more characteristics of the second receiver based on the processing of the output signal.

16. A method for receiver calibration, comprising:

generating a first oscillating signal via a first oscillating signal generation circuit of a first receiver;

splitting the first oscillating signal to generate a first plurality of oscillating signals;

providing the first plurality of oscillating signals to respective signal inputs of a first plurality of mixers of a second receiver;

generating, via a second oscillating signal generation circuit of the second receiver, a local-oscillator (LO) signal;

providing the LO signals to respective LO inputs of the first plurality of mixers of the second receiver; and down-converting the first plurality of oscillating signals via the first plurality of mixers to yield down-converted signals;

processing the down-converted signals for calibration; and configuring one or more components of the second receiver based on the processing.

17. The method of claim 16, wherein:

the first oscillating signal generation circuit comprises a first phase-locked loop (PLL); and the second oscillating signal generation circuit comprises a second PLL.

18. The method of claim 16, further comprising generating a second oscillating signal via the second oscillating signal generation circuit of the second receiver;

splitting the second oscillating signal to generate a second plurality of oscillating signals;

providing the second plurality of oscillating signals to respective signal inputs of a second plurality of mixers of the first receiver;

generating a second local-oscillator (LO) signal; and providing the second LO signal to respective LO inputs of the second plurality of mixers.

19. The method of claim 18, wherein the second LO signal is generated via the first oscillating signal generation circuit of the first receiver.

20. The method of claim 16, further comprising generating a second oscillating signal via a third oscillating signal generation circuit of a third receiver;

splitting the second oscillating signal to generate a second plurality of oscillating signals; and combining the first plurality of oscillating signals with the second plurality of oscillating signals to generate a plurality of combined signals, respectively, wherein providing the first plurality of oscillating signals to the respective signal inputs of the first plurality of mixers comprises providing the plurality of combined signals to the respective signal inputs of the first plurality of mixers.

*    *    *    *    *